(12) United States Patent
Kim

(10) Patent No.: US 8,901,651 B2
(45) Date of Patent: Dec. 2, 2014

(54) POWER SEMICONDUCTOR DEVICE

(71) Applicant: KEC Corporation, Seoul (KR)

(72) Inventor: Tae Wan Kim, Seoul (KR)

(73) Assignee: KEC Corporation, Seoul (KR)

( * ) Notice: Subject to any disclaimer, the term of this patent is extended or adjusted under 35 U.S.C. 154(b) by 0 days.

(21) Appl. No.: 14/074,359

(22) Filed: Nov. 7, 2013

(65) Prior Publication Data

US 2014/0159152 A1    Jun. 12, 2014

(30) Foreign Application Priority Data

Dec. 12, 2012  (KR) .................. 10-2012-0144751

(51) Int. Cl.
*H01L 29/66*   (2006.01)
*H01L 29/78*   (2006.01)
*H01L 29/06*   (2006.01)

(52) U.S. Cl.
CPC ........ *H01L 29/7818* (2013.01); *H01L 29/0634* (2013.01)
USPC ........... 257/339; 257/328; 257/329; 257/331; 257/335; 257/E29.066

(58) Field of Classification Search
CPC ..................... H01L 29/7811; H01L 27/0255
USPC ......... 257/288, 328, 329, 330, 331, 335, 339, 257/355, 393, 487, 494, 495, E29.027, 257/E29.066, E29.127
See application file for complete search history.

(56) References Cited

U.S. PATENT DOCUMENTS

| | | | |
|---|---|---|---|
| 6,696,728 B2* | 2/2004 | Onishi et al. ................. | 257/341 |
| 6,825,565 B2* | 11/2004 | Onishi et al. ................. | 257/773 |
| 7,592,668 B2* | 9/2009 | Kocon ......................... | 257/335 |
| 8,455,956 B2* | 6/2013 | Saggio et al. ................ | 257/401 |
| 2003/0222327 A1* | 12/2003 | Yamaguchi et al. ......... | 257/500 |
| 2005/0167742 A1* | 8/2005 | Challa et al. ................ | 257/328 |
| 2006/0220156 A1* | 10/2006 | Saito et al. .................. | 257/409 |
| 2008/0001223 A1* | 1/2008 | Saggio et al. ................ | 257/341 |
| 2011/0156139 A1* | 6/2011 | Hsieh ........................... | 257/331 |
| 2012/0146055 A1* | 6/2012 | Mitani et al. ................. | 257/77 |
| 2012/0273871 A1 | 11/2012 | Yedinak et al. | |
| 2012/0273916 A1* | 11/2012 | Yedinak et al. .............. | 257/471 |
| 2014/0151785 A1* | 6/2014 | Akagi et al. ................. | 257/329 |
| 2014/0209970 A1* | 7/2014 | Schulze et al. ............... | 257/139 |

FOREIGN PATENT DOCUMENTS

| | | |
|---|---|---|
| JP | 2007-116190 | 5/2007 |
| KR | 10-2010-0083153 | 7/2010 |
| KR | 10-1148279 | 5/2012 |

* cited by examiner

*Primary Examiner* — Eduardo A Rodela

(57) ABSTRACT

A power semiconductor device is provided, which can prevent an electric field from concentrating on a diode region, and can improve a breakdown voltage by creating an impurity concentration gradient in the diode region to increase from a termination region to an active cell region to cause reverse current to be distributed to the active cell region.

20 Claims, 4 Drawing Sheets

POWER SEMICONDUCTOR DEVICE

CROSS-REFERENCE TO RELATED APPLICATION

This application claims priority to and the benefit of Korean Patent Application No. 10-2012-0144751 filed on Dec. 12, 2012, which is herein incorporated by reference in its entirety.

BACKGROUND OF THE INVENTION

1. Field of the Invention

Aspects of the present invention relate to a power semiconductor device.

2. Description of the Related Art

In general, in order to improve the withstand voltage of a power semiconductor device, a structure having a column region formed in an epitaxial region, is used, the column region and the epitaxial region having opposite conductivity types.

In a planar structure of the power semiconductor device, there are provided a source region having the power semiconductor device formed therein, an active cell region having a gate oxide layer and a gate formed therein, a diode region formed outside the active cell region and corresponding to a body region of a cell, and a termination region formed outside the diode region.

In the power semiconductor device, if a voltage applied to the gate of the active cell region is interrupted, an electric field based on a reverse bias may concentrate on a region between the diode region and the termination region due to a reduced channel length. Accordingly, the power semiconductor device may have a lowered withstand voltage in the active cell region.

SUMMARY OF THE INVENTION

Aspects of the present invention provide a power semiconductor device, which can prevent an electric field from concentrating on a diode region.

Other aspects of the present invention provide a power semiconductor device, which can improve a breakdown voltage.

In accordance with one aspect of the present invention, there is provided a power semiconductor device having an active cell region, a diode region formed outside the active cell region and a termination region formed outside the diode region, the power semiconductor device including a semiconductor layer of a first conductivity type and a plurality of columns of a second conductivity type, formed in the active cell region, the diode region and the termination region, the plurality of second conductivity type columns spaced apart from each other to have a predetermined depth on the first conductivity type semiconductor; a first well region of second conductivity type, formed in the diode region to have a predetermined depth on the first conductivity type semiconductor layer and the plurality of second conductivity type columns; a second well region of second conductivity type, formed at a side adjacent to the active cell region to have a predetermined depth on the second conductivity type first well region; and a third well region of second conductivity type, formed to have a predetermined depth on locations of the second conductivity type columns in the diode region, the locations corresponding to the second conductivity type columns adjacent to the termination region, wherein the second conductivity type first well region has an impurity concentration lower than the second conductivity type second well region and higher than the second conductivity type third well region.

A third well region of second conductivity type may be formed in the termination region to have a predetermined depth on locations corresponding to the plurality of second conductivity type columns.

The power semiconductor device may further include an insulation layer formed in the diode region to cover top portions of the second conductivity type first well region, the second conductivity type second well region and the second conductivity type third well region.

The insulation layer may be formed in the termination region to cover top portions of the second conductivity type third well region and the first conductivity type semiconductor layer.

The second conductivity type first well region and the second conductivity type third well region in the diode region may be brought into contact with each other.

The second conductivity type third well region may have a lower impurity concentration than the plurality of second conductivity type columns.

The power semiconductor device may further include a substrate of first conductivity type, formed under the first conductivity type semiconductor layer.

The power semiconductor device may further include in the active cell region a first well region of second conductivity type, formed to have a predetermined depth on the second conductivity type columns; and a source region of first conductivity type, formed to have a predetermined depth on the second conductivity type first well region.

The power semiconductor device may further include in the active cell region a gate electrode formed on the second conductivity type first well region and the first conductivity type source region.

The first conductivity type may be a conductivity type of a semiconductor region doped with an n type impurity, and the second conductivity type may be a conductivity type of a semiconductor region doped with a p type impurity.

As described above, the power semiconductor device according to the embodiment of the present invention can prevent an electric field from concentrating on a diode region.

In addition, the power semiconductor device according to the embodiment of the present invention can improve a breakdown voltage.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present disclosure will be described in detail with reference to the accompanying drawings in such a manner that the technical idea of the present disclosure may easily be carried out by a person with ordinary skill in the art to which the invention pertains. Objects, operations, effects, other objects, characteristics and advantages of the present disclosure will be easily understood from an explanation of a preferred embodiment that will be described in detail below by reference to the attached drawings.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

Figure 1:
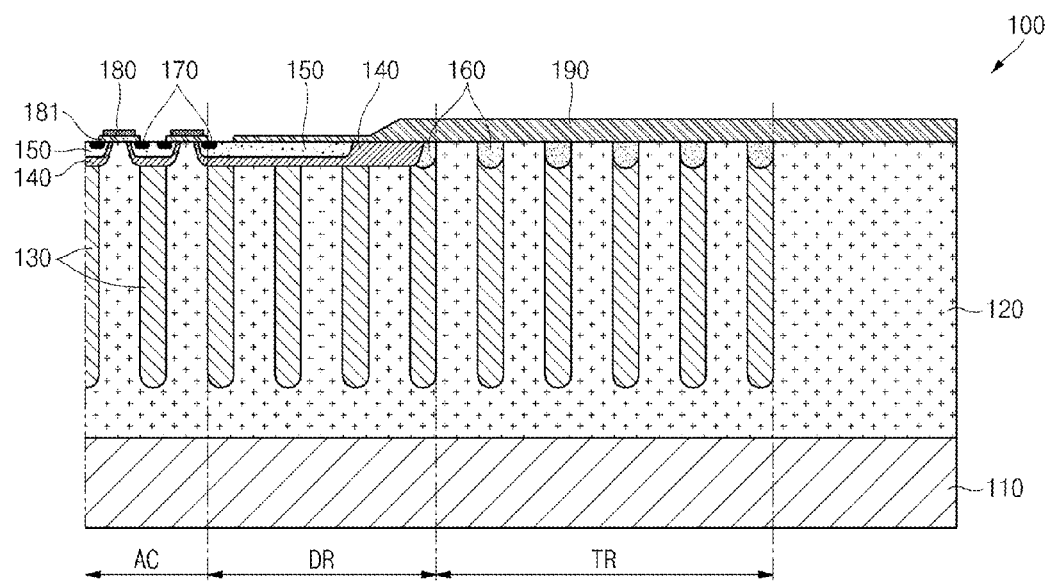
FIG. 1 is a cross-sectional view illustrating a power semiconductor device according to an embodiment of the present invention.

Referring to FIG. 1, a cross-sectional view illustrating a power semiconductor device according to an embodiment of the present invention is illustrated.

As illustrated in FIG. 1, in a horizontal cross-sectional view, the power semiconductor device 100 includes an active cell region AC, a diode region DR formed outside the active cell region AC and a termination region TR formed outside the diode region DR.

In addition, a substantially plate-shaped substrate 110 of first conductivity type, a semiconductor layer 120 of a first conductivity type, formed on the first conductivity type substrate 110, and a plurality of second conductivity type columns 130 spaced apart from each other to have a predetermined depth on the first conductivity type semiconductor layer 120, are formed in the active cell region AC, the diode region DR and the termination region TR. In addition, the power semiconductor device 100 further includes a first well region 140 of second conductivity type, a second well region 150 of second conductivity type, a third well region 160 of second conductivity type, a source region 170 of first conductivity type, a gate electrode 180 and an insulation layer 190, formed in at least one of the active cell region AC, the diode region DR and the termination region TR. The first conductivity type may mean, for example, an n type impurity included in silicon. In addition, the second conductivity type may mean, for example, a p type impurity included in silicon.

The first conductivity type substrate 110 is substantially plate-shaped and is formed all over the active cell region AC, the diode region DR and the termination region TR. The first conductivity type substrate 110 may correspond to a base layer to make a semiconductor layer grow, and may be an n+ type semiconductor wafer formed by implanting an n type impurity, such as phosphorus (P).

The first conductivity type semiconductor layer 120 is formed on the first conductivity type substrate 110. The first conductivity type semiconductor layer 120 may be an epitaxial layer grown on the first conductivity type substrate 110. Therefore, the first conductivity type semiconductor layer 120 is an n type semiconductor having a smaller concentration than the first conductivity type substrate 110.

The plurality of second conductivity type columns 130 are formed to have a predetermined depth on the first conductivity type semiconductor layer 120 toward the underlying first conductivity type substrate 110. That is to say, the second conductivity type columns 130 are plurally formed to be spaced apart from each other toward the first conductivity type substrate 110 in the first conductivity type semiconductor layer 120. In the illustrated embodiment, the plurality of second conductivity type columns 130 has a smaller depth than the first conductivity type semiconductor layer 120. However, the plurality of second conductivity type columns 130 and the first conductivity type semiconductor layer 120 may have the same thickness (depth).

The plurality of second conductivity type columns 130 may be P type semiconductors formed by making the first conductivity type semiconductor layer 120 grow on the first conductivity type substrate 110 to a predetermined thickness and implanting p type impurity into the grown first conductivity type semiconductor layer 120. The growing of the first conductivity type semiconductor layer 120 on the first conductivity type substrate 110 and the implanting of p type impurity may be sequentially repeated, thereby forming the second conductivity type columns 130 in the first conductivity type semiconductor layer 120 in a vertical direction.

The second conductivity type first well region 140 is formed in the active cell region AC and the diode region DR. The second conductivity type first well region 140 formed in the active cell region AC has a predetermined depth on the second conductivity type columns 130 toward the first conductivity type substrate 110. In addition, the second conductivity type first well region 140 formed in the diode region DR has a predetermined depth on the first conductivity type semiconductor layer 120 and the second conductivity type columns 130 toward the first conductivity type substrate 110.

The second conductivity type first well region 140 may be a P type semiconductor formed by implanting impurity, specifically p type impurity, such as boron (B), to have a predetermined depth from top surfaces of the first conductivity type semiconductor layer 120 and the second conductivity type columns 130 toward the first conductivity type substrate 110 and diffusing the same. In addition, the top surface of the second conductivity type first well region 140 may be on the same level with the top surface of the first conductivity type semiconductor layer 120.

The second conductivity type first well region 140 of the active cell region AC is formed to correspond to the second conductivity type columns 130. That is to say, the second conductivity type first well region 140 of the active cell region AC is formed in the first conductivity type semiconductor layer 120 such that its bottom surface is brought into contact with the top surface of the second conductivity type columns 130.

The second conductivity type first well region 140 of the diode region DR is formed to connect all of the second conductivity type columns 130 formed in the diode region DR. In the illustrated embodiment, four second conductivity type columns 130 formed in the diode region DR are exemplified, which is, however, provided only for illustration. However, the present invention does not limit the number of second conductivity type columns 130 formed in the diode region DR to 4 illustrated herein.

The second conductivity type second well region 150 is formed in the second conductivity type first well region 140 of the diode region DR. In addition, the second conductivity type second well region 150 is formed in the second conductivity type first well region 140 to have a predetermined depth on the second conductivity type first well region 140 toward the first conductivity type substrate 110. That is to say, the second conductivity type second well region 150 is formed to a smaller depth than the second conductivity type first well region 140. In addition, the second conductivity type second well region 150 is formed in the second conductivity type first well region 140 to be adjacent to the active cell region AC.

The second conductivity type second well region 150 may also be formed within the second conductivity type first well region 140 formed in the active cell region AC.

The second conductivity type second well region 150 may be a P+ type semiconductor formed by implanting p type impurity, such as boron (B), to a predetermined depth from the top surface of the second conductivity type first well region 140 toward the first conductivity type substrate 110 and diffusing the p type impurity. Therefore, the second conductivity type second well region 150 may have a greater impurity concentration than the second conductivity type first well region 140.

The second conductivity type third well region 160 is formed in the diode region DR and the termination region TR. The second conductivity type third well region 160 of the diode region DR is formed at a location corresponding to the second conductivity type columns 130 adjacent to the termination region TR. The second conductivity type third well region 160 of the termination region TR is formed to have a predetermined depth on locations corresponding to the second conductivity type columns 130.

The second conductivity type third well region 160 may be formed at the final stage for forming the second conductivity type columns 130 through growing of the first conductivity type semiconductor layer 120 and implanting of P type impurity. That is to say, the second conductivity type third well region 160 may be formed by forming the second conductivity type columns 130 by repeating the growing of the first conductivity type semiconductor layer 120 and the implanting of P type impurity, making the first conductivity type semiconductor layer 120 grow and implanting low concentration P type impurity into locations corresponding to the second conductivity type columns 130, but aspects of the present invention are not limited thereto.

The second conductivity type third well region 160 may be a P− type semiconductor having a lower concentration than the second conductivity type second well region 150 and the second conductivity type columns 130.

The second conductivity type first well region 140, the second conductivity type second well region 150 and the second conductivity type third well region 160 are formed in the diode region DR. That is to say, the second conductivity type third well region 160, the second conductivity type first well region 140 and the second conductivity type second well region 150, which are P type semiconductors having an increasing impurity concentration gradient in the diode region DR, are sequentially formed from the termination region TR to the active cell region AC.

The first conductivity type source region 170 may be formed in the active cell region AC and the diode region DR. The first conductivity type source region 170 formed in the active cell region AC are formed to have a predetermined depth on a top surface of the second conductivity type second well region 150 toward the second conductivity type columns 130. The first conductivity type source region 170 formed in the diode region DR may be formed at one side region of the second conductivity type second well region 150, which is adjacent to the active cell region AC. The first conductivity type source region 170 may be an n type semiconductor formed by implanting n type impurity, such as phosphorus (P), to a predetermined depth from the top surface of the second conductivity type second well region 150 and diffusing the n type impurity.

The gate electrode 180 is formed in the active cell region AC. The gate electrode 180 is formed on two second conductivity type first well regions 140 adjacent to each other with a gate insulation layer 181 disposed therebetween. The gate electrode 180 may be formed of doped polysilicon.

The insulation layer 190 is formed in the diode region DR and the termination region TR. The insulation layer 190 may be formed to cover the top surfaces of the second conductivity type first well region 140, the second conductivity type second well region 150 and the second conductivity type third well region 160 in the diode region DR while covering the top surfaces of second conductivity type third well region 160 and the first conductivity type semiconductor layer 120 in the termination region TR. The insulation layer 190 may be an oxide layer. However, those of skill in the art will readily recognize, in light of this disclosure, that many different types of materials can be used for the insulation layer 190.

Although not shown, the gate insulation layer 181 and the gate electrode 180 are covered by an interlayer dielectric layer in the active cell region AC, and a source metal is deposited on the first conductivity type source region 170 exposed to the outside of the interlayer dielectric layer. In addition, a drain metal is further deposited on a bottom surface of the first conductivity type substrate 110. In addition, a gate metal is electrically connected to the gate electrode 180.

As such, a potential difference may be created between the source metal and the drain metal and a voltage greater than or equal to a threshold voltage may then be applied to the gate metal in the active cell region AC. Accordingly, a channel is formed in the second conductivity type second well region 150 between the first conductivity type source region 170 and the first conductivity type semiconductor layer 120 and electricity may be generated between the source metal and the drain metal by the channel.

If the voltage applied to the gate metal is interrupted, charges of the channel are reduced, so that a reverse bias is applied to the diode region DR. Here, since the P type semiconductors having an increasing impurity concentration gradient in the diode region DR are sequentially formed from the termination region TR to the active cell region AC, it is possible to prevent the electric field from concentrating between the diode region DR and the termination region TR. That is to say, a difference in the impurity concentration is created in the diode region DR, thereby moving the current based on the reverse bias from the diode region DR to the active cell region AC.

The termination region TR may have an improved breakdown voltage by forming the second conductivity type third well region 160 having a low impurity concentration on the second conductivity type columns 130 and reducing the electric field of the diode region DR. That is to say, the breakdown voltage of the termination region TR becomes higher than the breakdown voltage of the active cell region AC, thereby increasing stability of the power semiconductor device.

Figure 2A:
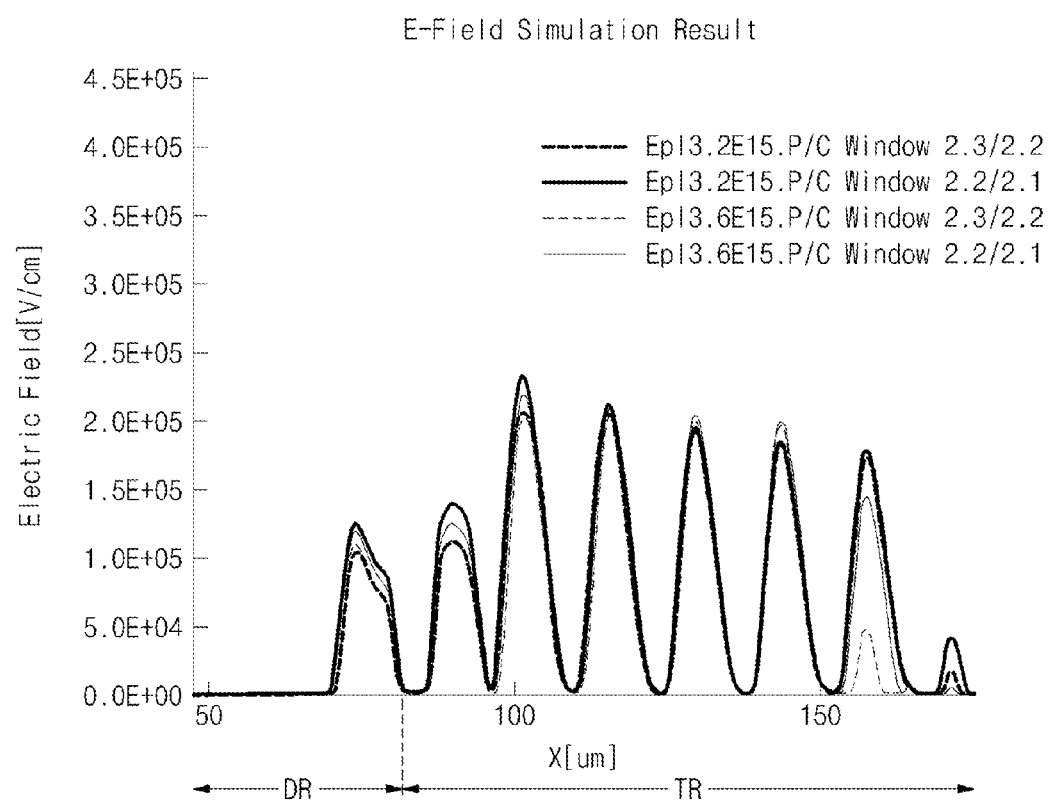
FIGS. 2A and 2B illustrate simulation results of electric fields of various regions of the power semiconductor device shown in FIG. 1 and a conventional power semiconductor device.
Figure 2B:
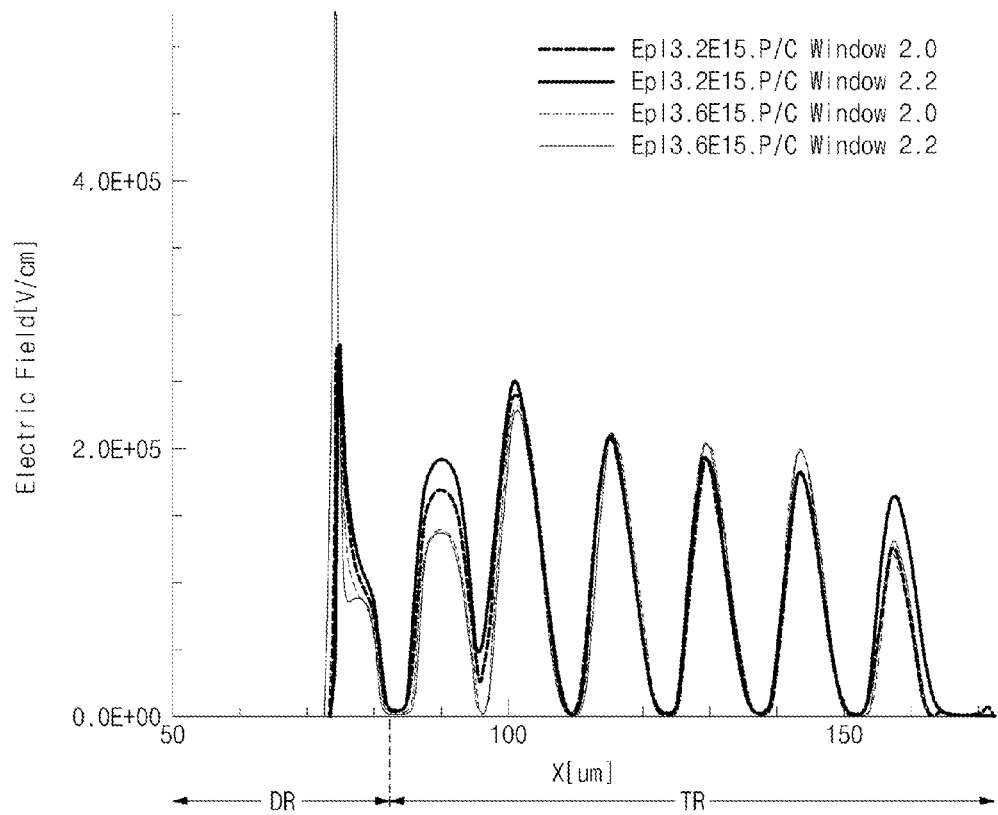

Referring to FIG. 2A, an electric field simulation result for various regions of the power semiconductor device shown in FIG. 1 are illustrated. Referring to FIG. 2B, an electric field simulation result of various regions of a conventional power semiconductor device having the same impurity concentration in a diode region are illustrated.

As illustrated in FIG. 2A, since the P type semiconductors having an increasing impurity concentration gradient in the diode region DR are sequentially formed from the termination region TR to the active cell region AC, the electric fields do not concentrate between the second conductivity type second well region 150 and the second conductivity type third well region 160.

By contrast, as illustrated in FIG. 2B, the simulation result of electric fields of various regions of a conventional power semiconductor device having the same impurity concentration in the diode region shows that the electric field concentrates in the diode region DR adjacent to the termination region TR.

That is to say, according to the present invention, since the impurity concentrations in the diode region DR gradually increase from the termination region TR to the active cell region AC, the reverse current is distributed to the active cell region AC, it is possible to prevent the electric field from concentrating on the diode region DR.

Figure 3:
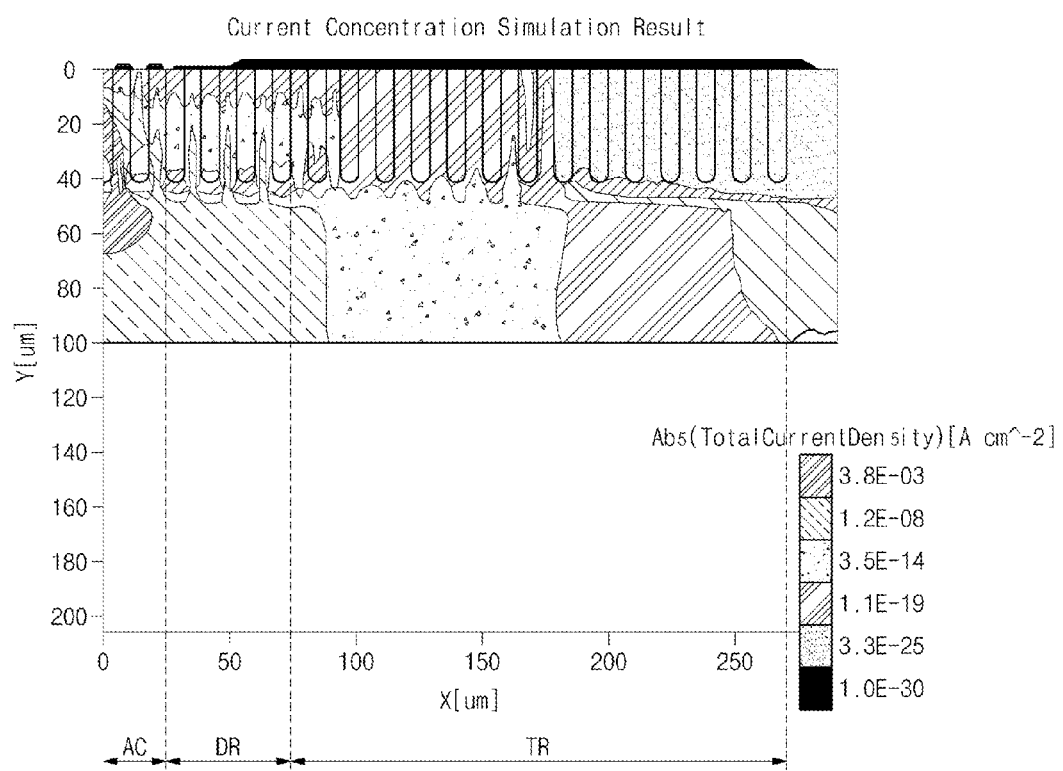
FIG. 3 illustrates a simulation result of reverse current of the power semiconductor device shown in FIG. 1.

Referring to FIG. 3, a simulation result of reverse current of the power semiconductor device shown in FIG. 1 is illustrated. As illustrated in FIG. 3, the diode region DR on which the electric field does not concentrate may also prevent the reverse current from concentrating thereon.

Although the power semiconductor device according to an exemplary embodiment of the present invention has been described in detail hereinabove, it should be understood that many variations and modifications of the basic inventive concept herein described, which may appear to those skilled in the art, will still fall within the spirit and scope of the exemplary embodiments of the present invention as defined by the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A power semiconductor device having an active cell region, a diode region formed outside the active cell region and a termination region formed outside the diode region, the power semiconductor device comprising:

a semiconductor layer of a first conductivity type and a plurality of columns of a second conductivity type, formed in the active cell region, the diode region and the termination region, the plurality of second conductivity type columns spaced apart from each other to have a predetermined depth on the first conductivity type semiconductor;

a first well region of second conductivity type, formed in the diode region to have a predetermined depth on the first conductivity type semiconductor layer and the plurality of second conductivity type columns;

a second well region of second conductivity type, formed at a side adjacent to the active cell region to have a predetermined depth on the second conductivity type first well region; and a third well region of second conductivity type, formed to have a predetermined depth on locations of the second conductivity type columns in the diode region, the locations corresponding to the second conductivity type columns adjacent to the termination region, wherein the second conductivity type first well region has an impurity concentration lower than the second conductivity type second well region and higher than the second conductivity type third well region.

2. The power semiconductor device of claim 1, wherein the third well region of second conductivity type is further formed in the termination region to have a predetermined depth on locations corresponding to the plurality of second conductivity type columns.

3. The power semiconductor device of claim 2, further comprising an insulation layer formed in the diode region to cover top portions of the second conductivity type first well region, the second conductivity type second well region and the second conductivity type third well region.

4. The power semiconductor device of claim 3, wherein the insulation layer is further formed in the termination region to cover top portions of the second conductivity type third well region and the first conductivity type semiconductor layer.

5. The power semiconductor device of claim 3, wherein the insulation layer is an oxide layer.

6. The power semiconductor device of claim 1, wherein the second conductivity type first well region and the second conductivity type third well region in the diode region are brought into contact with each other.

7. The power semiconductor device of claim 1, wherein the second conductivity type third well region has a lower impurity concentration than the plurality of second conductivity type columns.

8. The power semiconductor device of claim 1, further comprising a substrate of first conductivity type, formed under the first conductivity type semiconductor layer.

9. The power semiconductor device of claim 1, wherein the first well region of second conductivity type is further formed in the active cell region to have a predetermined depth on the second conductivity type columns.

10. The power semiconductor device of claim 9, further comprising a source region of first conductivity type formed in the active cell region to have a predetermined depth on the second conductivity type first well region.

11. The power semiconductor device of claim 10, further comprising in the active cell region a gate electrode formed on the second conductivity type first well region and the first conductivity type source region.

12. The power semiconductor device of claim 10, wherein the second conductivity type first well region in the active cell region is brought into contact with the top surface of the second conductivity type columns.

13. The power semiconductor device of claim 9, wherein the second conductivity type first well region in the active cell region is brought into contact with the top surface of the second conductivity type columns.

14. The power semiconductor device of claim 1, further comprising an insulation layer formed in the diode region to cover top portions of the second conductivity type first well region, the second conductivity type second well region and the second conductivity type third well region.

15. The power semiconductor device of claim 14, wherein the insulation layer is further formed in the termination region to cover top portions of the second conductivity type third well region and the first conductivity type semiconductor layer.

16. The power semiconductor device of claim 1, wherein the first conductivity type is a conductivity type of a semiconductor region doped with an n type impurity, and the second conductivity type is a conductivity type of a semiconductor region doped with a p type impurity.

17. A power semiconductor device having an active cell region, a diode region formed outside the active cell region and a termination region formed outside the diode region, the power semiconductor device comprising:
  a semiconductor layer of a first conductivity type and a plurality of columns of a second conductivity type, formed in the active cell region, the diode region and the termination region, the plurality of second conductivity type columns spaced apart from each other to have a predetermined depth on the first conductivity type semiconductor;
  a first well region of second conductivity type, formed in the diode region to have a predetermined depth on the first conductivity type semiconductor layer and the plurality of second conductivity type columns;
  a second well region of second conductivity type, formed at a side adjacent to the active cell region to have a predetermined depth on the second conductivity type first well region; and
  a third well region of second conductivity type, formed to have a predetermined depth on locations of the second conductivity type columns in the diode region, the locations corresponding to the second conductivity type columns adjacent to the termination region,
  wherein the third well region of second conductivity type is further formed in the termination region to have a predetermined depth on locations corresponding to the plurality of second conductivity type columns.

18. The power semiconductor device of claim 17, further comprising an insulation layer formed in the diode region to cover top portions of the second conductivity type first well region, the second conductivity type second well region and the second conductivity type third well region.

19. The power semiconductor device of claim 18, wherein the insulation layer is further formed in the termination region to cover top portions of the second conductivity type third well region and the first conductivity type semiconductor layer.

20. The power semiconductor device of claim 17, wherein the second conductivity type first well region and the second conductivity type third well region in the diode region are brought into contact with each other.

* * * * *